(12) United States Patent
Chang et al.

(10) Patent No.: US 12,400,935 B2
(45) Date of Patent: Aug. 26, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Chih-Wei Chang, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 665 days.

(21) Appl. No.: 17/648,722

(22) Filed: Jan. 24, 2022

(65) Prior Publication Data

US 2022/0293493 A1 Sep. 15, 2022

Related U.S. Application Data

(63) Continuation of application No. PCT/CN2021/112594, filed on Aug. 13, 2021.

(30) Foreign Application Priority Data

Mar. 10, 2021 (CN) .......................... 202110265111.5

(51) Int. Cl.
*H01L 23/48* (2006.01)
*H01L 21/768* (2006.01)
(Continued)

(52) U.S. Cl.
CPC ...... *H01L 23/481* (2013.01); *H01L 21/76898* (2013.01); *H01L 23/373* (2013.01);
(Continued)

(58) Field of Classification Search
CPC ........... H01L 23/53228; H01L 23/5226; H01L 23/481; H01L 21/76898; H01L 23/373
See application file for complete search history.

(56) References Cited

U.S. PATENT DOCUMENTS

| 7,388,291 B2 | 6/2008 | Kurokawa et al. |
| 8,004,090 B2 | 8/2011 | Uchiyama |

(Continued)

FOREIGN PATENT DOCUMENTS

| CN | 1667812 A | 9/2005 |
| CN | 102651355 A | 8/2012 |

(Continued)

OTHER PUBLICATIONS

Wikipedia page of Borosilicate glass (Year: 2020); https://en.wikipedia.org/w/index.php?title=Borosilicate_glass&oldid=995441094Wikipedia page of Borosilicate glass (Year: 2020).*

(Continued)

*Primary Examiner* — Britt D Hanley
*Assistant Examiner* — Jason James Greaving
(74) *Attorney, Agent, or Firm* — Syncoda LLC; Feng Ma

(57) ABSTRACT

The present disclosure relates to the technical field of semiconductors, and proposes a semiconductor structure and a manufacturing method thereof. The semiconductor structure includes a base and a communication portion, the communication portion being located in the base and including a first connection layer, a second connection layer, and a third connection layer, the second connection layer being located on the first connection layer, and the third connection layer being located on the second connection layer; wherein the first connection layer, the second connection layer, and the third connection layer include different conductive materials, and thermal expansion coefficients of the second connection layer and the third connection layer are both less than a thermal expansion coefficient of the first connection layer.

11 Claims, 12 Drawing Sheets

(51) Int. Cl.
*H01L 23/373* (2006.01)
*H01L 23/522* (2006.01)
*H01L 23/532* (2006.01)

(52) U.S. Cl.
CPC .... *H01L 23/5226* (2013.01); *H01L 23/53228* (2013.01); *H01L 23/53276* (2013.01)

(56) References Cited

U.S. PATENT DOCUMENTS

| | | | |
|---|---|---|---|
| 8,921,984 | B2 | 12/2014 | Torii et al. |
| 9,059,262 | B2 | 6/2015 | Liu et al. |
| 9,269,651 | B2 | 2/2016 | Hong et al. |
| 9,620,480 | B1 | 4/2017 | Dimaculangan et al. |
| 10,090,248 | B2 | 10/2018 | Sato |
| 10,923,558 | B2 | 2/2021 | Managaki |
| 10,985,050 | B2 | 4/2021 | Zhang et al. |
| 2011/0108988 | A1* | 5/2011 | Lim ................ H01L 25/50 257/774 |
| 2011/0291267 | A1 | 12/2011 | Wang et al. |
| 2014/0015136 | A1 | 1/2014 | Gan et al. |
| 2014/0145332 | A1 | 5/2014 | Ryan et al. |
| 2015/0115462 | A1 | 4/2015 | Lin |
| 2015/0243583 | A1 | 8/2015 | Li et al. |
| 2016/0133574 | A1 | 5/2016 | Shroff et al. |
| 2017/0309549 | A1 | 10/2017 | Wachtler et al. |
| 2018/0182663 | A1* | 6/2018 | Zhang .............. H01L 21/3081 |
| 2020/0161221 | A1* | 5/2020 | Kang .............. H01L 23/481 |

FOREIGN PATENT DOCUMENTS

| | | |
|---|---|---|
| CN | 104011848 A | 8/2014 |
| CN | 105810649 A | 7/2016 |
| CN | 107731667 A | 2/2018 |
| CN | 108933101 A | 12/2018 |
| CN | 109950221 A | 6/2019 |
| CN | 112151503 A | 12/2020 |
| JP | 2008135482 A | 6/2008 |
| JP | 2009111061 A | 5/2009 |
| JP | 2013247139 A | 12/2013 |
| JP | 2015005659 A | 1/2015 |
| JP | 2019029468 A | 2/2019 |
| JP | 2019503580 A | 2/2019 |
| JP | 2020109452 A | 7/2020 |
| RU | 2695049 C1 | 7/2019 |
| WO | 2012013162 A1 | 2/2012 |

OTHER PUBLICATIONS

Listing of Thermal Expansion Coefficients (Year: 2020); https://web.archive.org/web/20201112015003/https://www.msesupplies.com/pages/list-of-thermal-expansion-coefficients-cte-for-natural-and-engineered-materials.*
Wikipedia page of Silicon (Year: 2020); https://en.wikipedia.org/w/index.php?title=Silicon&oldid=995277900.*
International Search Report cited in PCT/CN2021/112594 mailed Dec. 8, 2021, 9 pages.
International Search Report cited in PCT/CN2021/110616 mailed Dec. 17, 2021, 8 pages.
International Search Report cited in PCT/CN2021/110605 mailed Nov. 25, 2021, 9 pages.
European Search Report cited in EP21865335.0 mailed Mar. 6, 2023, 8 pages.
First JP Office Action cited in JP2022-538973 mailed May 23, 2023, 5 pages.
First RU Office Action cited in RU2022116826/28(035485) mailed May 24, 2023, 15 pages.

* cited by examiner

SEMICONDUCTOR STRUCTURE AND MANUFACTURING METHOD THEREOF

CROSS-REFERENCE TO RELATED APPLICATIONS

This is a continuation of International Application No. PCT/CN2021/112594, filed on Aug. 13, 2021, which claims the priority to Chinese Patent Application 202110265111.5, titled "SEMICONDUCTOR STRUCTURE AND MANUFACTURING METHOD THEREOF" and filed on Mar. 10, 2021. The entire contents of International Application No. PCT/CN2021/112594 and Chinese Patent Application 202110265111.5 are incorporated herein by reference.

TECHNICAL FIELD

The present disclosure relates to the technical field of semiconductors, and in particular to a semiconductor structure and a manufacturing method thereof.

BACKGROUND

In the prior art, a metal conductive material filled in a communication portion may affect the lattice around the communication portion during thermal expansion, thus affecting the performance of the semiconductor structure.

SUMMARY

The present disclosure provides a semiconductor structure and a manufacturing method thereof.

According to a first aspect of the present disclosure, a semiconductor structure is provided, including:
- a base;
- a communication portion, the communication portion being located in the base and the communication portion including a first connection layer, a second connection layer, and a third connection layer, the second connection layer being located on the first connection layer, and the third connection layer being located on the second connection layer;
- wherein the first connection layer, the second connection layer, and the third connection layer include different conductive materials, and thermal expansion coefficients of the second connection layer and the third connection layer are both less than a thermal expansion coefficient of the first connection layer.

According to a second aspect of the present disclosure, a semiconductor structure is provided, including:
- a base;
- a communication portion, the communication portion being located in the base and the communication portion including a first connection layer, a second connection layer, and a third connection layer, the second connection layer being located on the first connection layer, and the third connection layer being located on the second connection layer;
- wherein the second connection layer and the third connection layer both include graphene, and thermal expansion coefficients of the second connection layer and the third connection layer are both less than a thermal expansion coefficient of the first connection layer.

According to a third aspect of the present disclosure, a method of manufacturing a semiconductor structure is provided, including:

providing a matrix; and
forming a communication portion on the matrix, the communication portion including a first connection layer, a second connection layer, and a third connection layer, the second connection layer being formed on the first connection layer, and the third connection layer being formed on the second connection layer;
wherein the first connection layer, the second connection layer, and the third connection layer include different conductive materials, and thermal expansion coefficients of the second connection layer and the third connection layer are both less than a thermal expansion coefficient of the first connection layer.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

Figure 1:
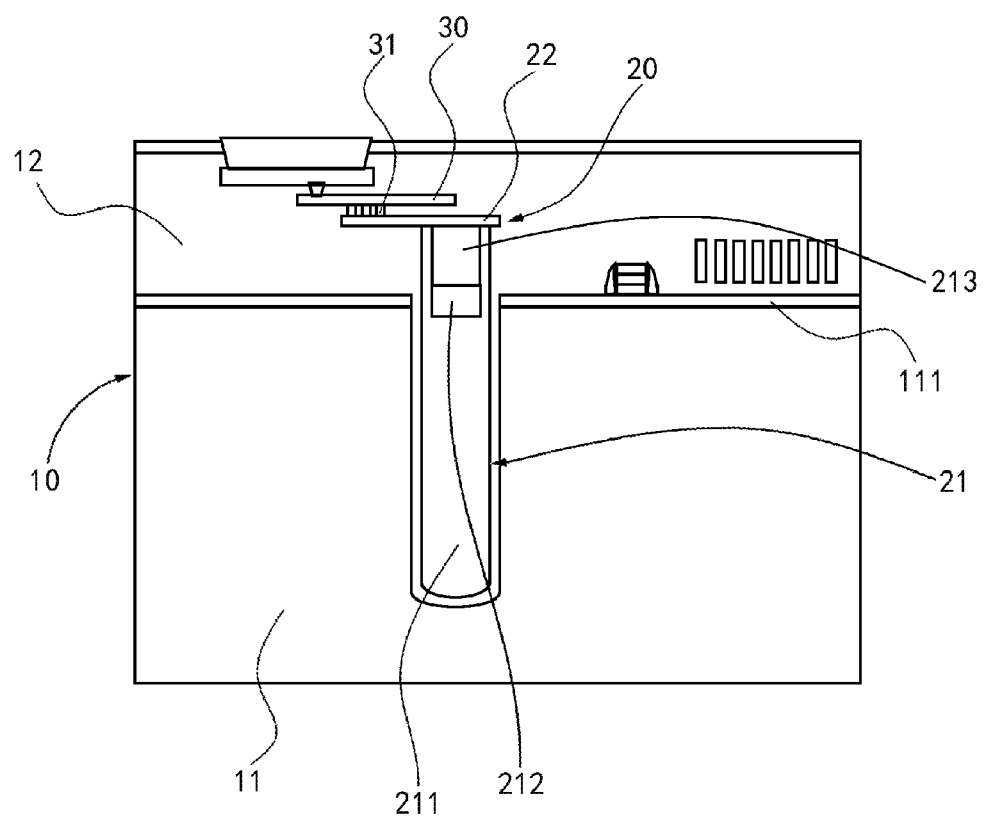
FIG. 1 is a schematic structural diagram of a semiconductor structure according to a first exemplary implementation.

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

An embodiment of the present disclosure provides a semiconductor structure. Referring to FIG. 1 to FIG. 5, the semiconductor structure includes: a base 10; and a communication portion 21, the communication portion 21 being located in the base 10, the communication portion 21 including a first connection layer 211, a second connection layer 212, and a third connection layer 213, the second connection layer 212 being located on the first connection layer 211, and the third connection layer 213 being located on the second connection layer 212; wherein the first connection layer 211, the second connection layer 212, and the third connection layer 213 include different conductive materials; thermal expansion coefficients of the second connection layer 212 and the third connection layer 213 are both less than a thermal expansion coefficient of the first connection layer 211.

The semiconductor structure in an embodiment of the present disclosure includes a base 10 and a communication portion 21, wherein the communication portion 21 includes a first connection layer 211, a second connection layer 212, and a third connection layer 213 that are made of different conductive materials; thermal expansion coefficients of the second connection layer 212 and the third connection layer 213 are both less than a thermal expansion coefficient of the first connection layer 211. That is, the second connection layer 212 and the third connection layer 213 change little under thermal expansion, thereby reducing the impact on the lattice around the communication portion 21, thus improving the performance of the semiconductor structure.

It should be noted that, since the thermal expansion coefficients of the second connection layer 212 and the third connection layer 213 are both less than the thermal expansion coefficient of the first connection layer 211, a material with a low thermal expansion coefficient is used as part of the conductive materials of the communication portion 21, to reduce the impact of metal thermal expansion on an active element region, and also reduce electrical changes of MOS elements in the peripheral lattice, thus reducing the size of the chip design. The second connection layer 212 and the third connection layer 213, which have lower thermal expansion coefficients, are deformed less under heat, thus avoiding squeezing the lattice around the communication portion 21 with a high pressure, thereby avoiding the impact on other components in the base 10.

In some embodiments, the communication portion 21 is a part of a conductive portion 20. The conductive portion 20 further includes a first conductive layer 22. The first conductive layer 22 is located above the communication portion 21, and the third connection layer 213 is connected to the first conductive layer 22. Because the second connection layer 212 and the third connection layer 213 are close to the first conductive layer 22, and the thermal expansion coefficients of the second connection layer 212 and the third connection layer 213 are relatively low, the first conductive layer 22 is not excessively squeezed.

In some embodiments, the communication portion 21 is a through-silicon via.

In an embodiment, the thermal expansion coefficient of the second connection layer 212 is less than the thermal expansion coefficient of the third connection layer 213. That is, in the communication portion 21, the conductive material with the lowest thermal expansion coefficient is located in the middle position. The base 10 is generally provided with a large number of components at a position corresponding to this middle position. Therefore, the conductive material with the lowest thermal expansion coefficient is subject to the smallest impact of thermal expansion, and basically will not squeeze components.

In an embodiment, the second connection layer 212 or the third connection layer 213 includes graphene, and the first connection layer 211 includes copper. Copper has a higher thermal expansion coefficient. However, since copper is arranged at the bottom, it does not affect the components in the base 10. The second connection layer 212 or the third connection layer 213 is closer to the components in the base 10, and graphene has a negative thermal expansion coefficient. Therefore, graphene can offset the thermal expansion of copper, thus avoiding the problem of squeezing.

In some embodiments, the first connection layer 211 is made of copper, the second connection layer 212 is made of graphene, and the third connection layer 213 is made of tungsten.

It should be noted that, when the second connection layer 212 includes graphene, which is sandwiched between the first connection layer 211 and the third connection layer 213, graphene that has a certain thermal storage function can absorb heat from the conductive materials with the higher thermal expansion coefficients, that is, absorb heat from the first connection layer 211 and the third connection layer 213, thereby reducing thermal expansion of other conductive materials.

When the second connection layer 212 includes graphene, heat generated by the first connection layer 211 and the second connection layer 212 can be transferred to the first conductive layer 22 via graphene in time, and transmitted out through a structure connected to the first conductive layer 22, thereby achieving the effect of rapid heat dissipation.

Figure 2:
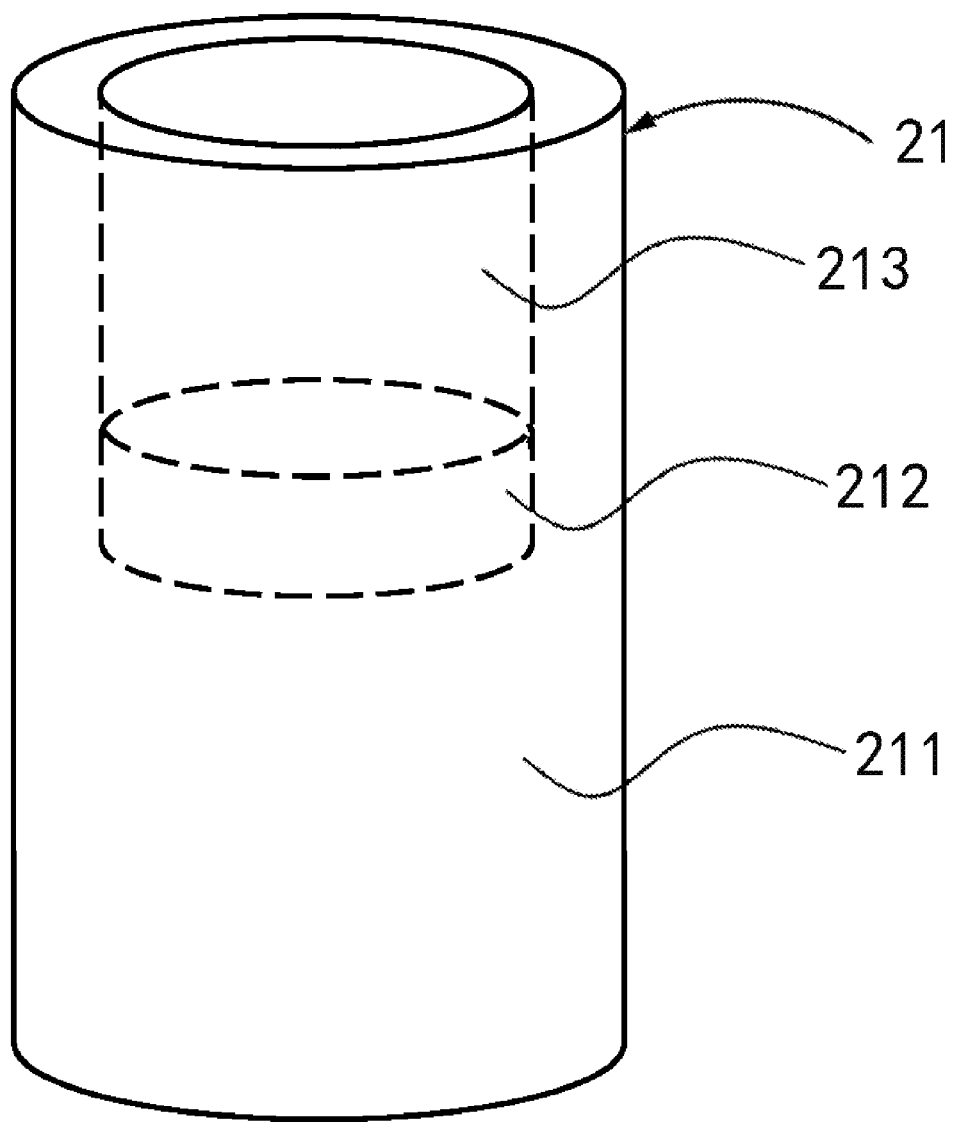
FIG. 2 is a schematic structural diagram of a communication portion of the semiconductor structure according to the first exemplary implementation.

In an embodiment, as shown in FIG. 1 and FIG. 2, the second connection layer 212 is located in the first connection layer 211, that is, the second connection layer 212 is peripherally surrounded by the first connection layer 211. The first connection layer 211 with the higher thermal expansion coefficient can protect the second connection layer 212. However, due to the lower thermal expansion coefficient of the second connection layer 212, the second connection layer 212 will not generate a large squeezing force due to thermal expansion.

In some embodiments, the second connection layer 212 is located in the first connection layer 211; the bottom of the third connection layer 213 is flush with the top of the second connection layer 212 and the top of the first connection layer 211.

In some embodiments, the second connection layer 212 is located in the first connection layer 211, and the third connection layer 213 is located in the first connection layer 211. That is, the second connection layer 212 and the third connection layer 213 are both peripherally surrounded by the first connection layer 211, specifically as shown in FIG. 1 and FIG. 2.

In an embodiment, as shown in FIG. 1 and FIG. 2, in a direction perpendicular to the base 10, projection of the second connection layer 212 coincides with projection of the third connection layer 213, that is, a cross sectional area of the second connection layer 212 is equal to a cross section of the third connection layer 213.

Optionally, the top of the third connection layer 213 is flush with the top of the first connection layer 211. In this case, a groove is formed in the first connection layer 211. The second connection layer 212 and the third connection layer 213 are located in the groove, and the top of the first connection layer 211 and the top of the third connection layer 213 are connected to the first conductive layer 22, specifically as shown in FIG. 1 and FIG. 2. In this embodiment, the first connection layer 211, the second connection layer 212, and the third connection layer 213 include different conductive materials. The thermal expansion coefficient of the second connection layer 212 is less than the thermal expansion coefficient of the third connection layer 213, and the thermal expansion coefficient of the third connection layer 213 is less than the thermal expansion coefficient of the first connection layer 211. The first connection layer 211 is made of copper, the second connection layer 212 is made of graphene, and the third connection layer 213 is made of tungsten.

Figure 3:
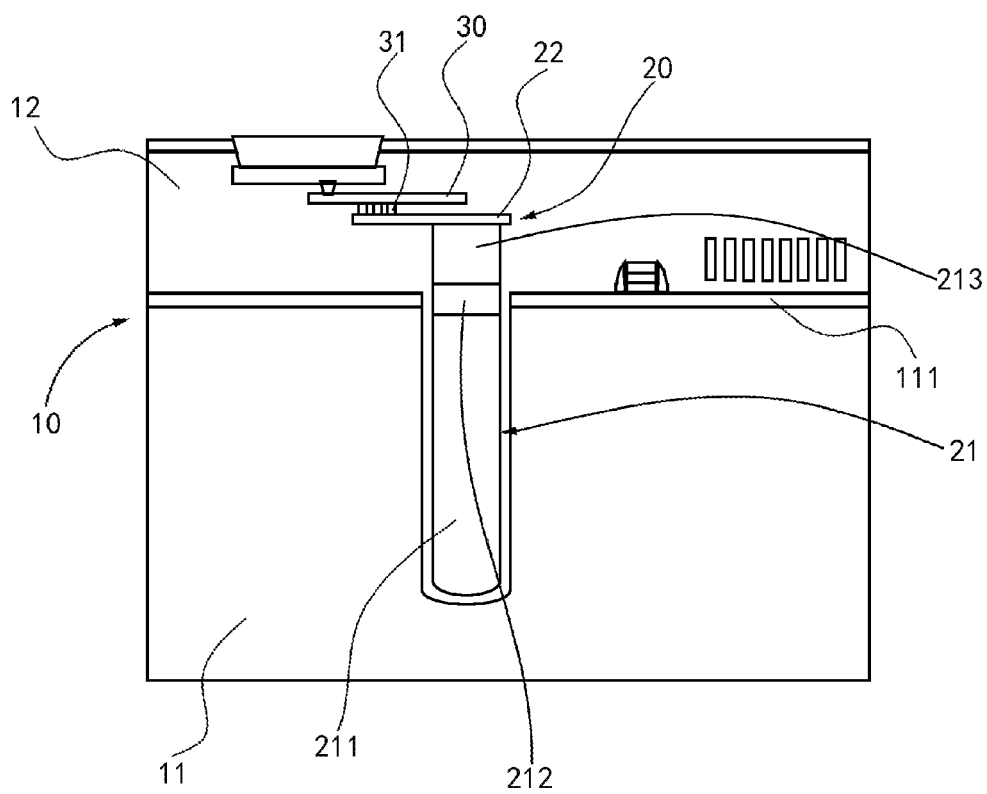
FIG. 3 is a schematic structural diagram of a semiconductor structure according to a second exemplary implementation.
Figure 4:
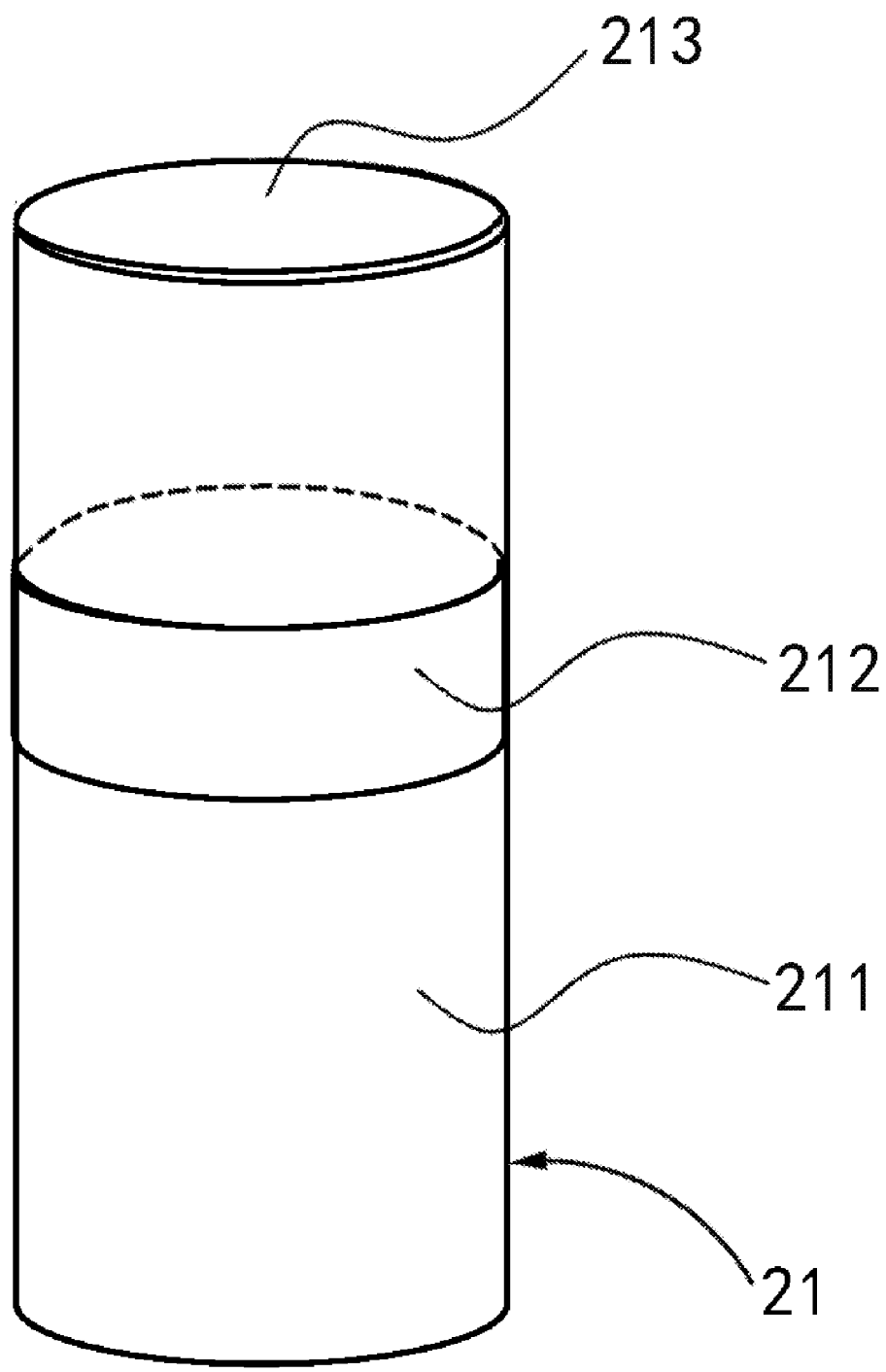
FIG. 4 is a schematic structural diagram of a communication portion of the semiconductor structure according to the second exemplary implementation.

In an embodiment, as shown in FIG. 3 and FIG. 4, in the direction perpendicular to the base 10, projection of the first connection layer 211, projection of the second connection layer 212, and projection of the third connection layer 213 coincide with each other. That is, the first connection layer 211, the second connection layer 212, and the third connection layer 213 are sequentially stacked along a height direction of the base 10, and the cross sectional area of the first connection layer 211, the cross sectional area of the second connection layer 212, and the cross sectional area of the third connection layer 213 are equal. In this case, only the third connection layer 213 is directly connected to the first conductive layer 22. In this embodiment, the first connection layer 211, the second connection layer 212, and the third connection layer 213 include different conductive materials. The thermal expansion coefficient of the second connection layer 212 is less than the thermal expansion coefficient of the third connection layer 213, and the thermal expansion coefficient of the third connection layer 213 is less than the thermal expansion coefficient of the first connection layer 211. The first connection layer 211 is made of copper, the second connection layer 212 is made of graphene, and the third connection layer 213 is made of tungsten.

Figure 5:
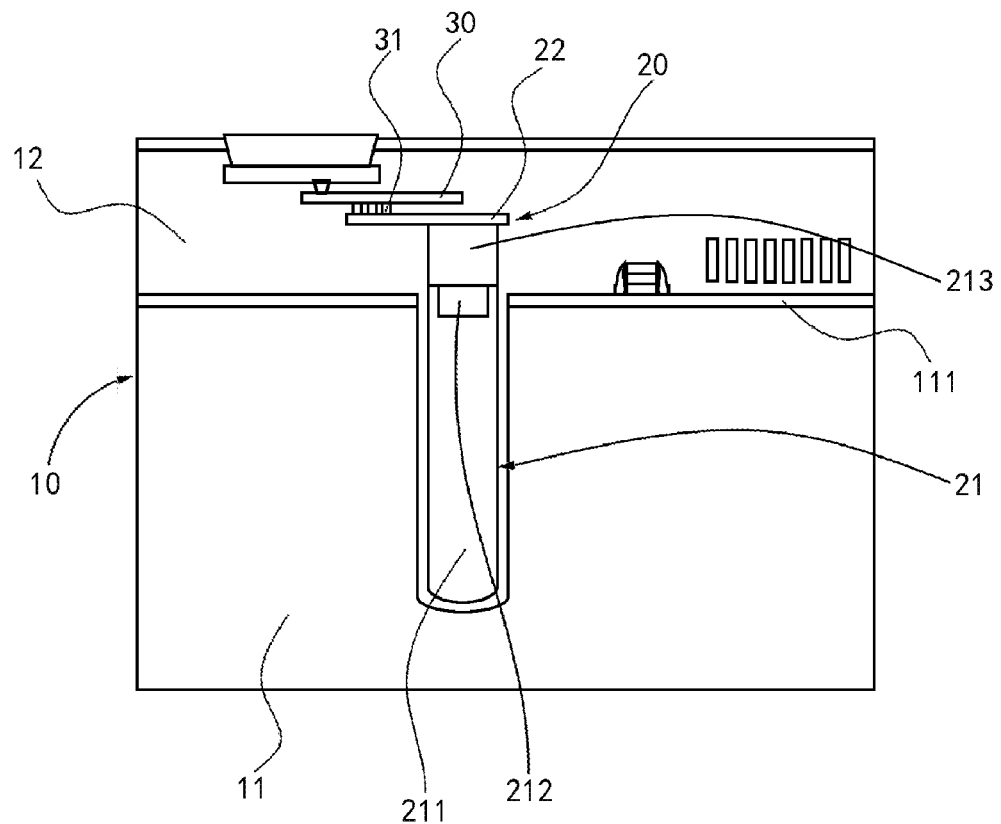
FIG. 5 is a schematic structural diagram of a semiconductor structure according to a third exemplary implementation.

In some embodiments, as shown in FIG. 5, the second connection layer 212 is located in the first connection layer 211, and in the direction perpendicular to the base 10, projection of the first connection layer 211 coincides with projection of the third connection layer 213. That is, the bottom of the third connection layer 213 is flush with the top of the second connection layer 212 and the top of the first connection layer 211.

In an embodiment, as shown in FIG. 1, FIG. 3 and FIG. 5, the base 10 includes: a silicon substrate 11, the bottom of the second connection layer 212 being lower than an upper surface of the silicon substrate 11; and an insulation layer 12, the insulation layer 12 covers the upper surface of the silicon substrate 11 and covers an outer surface of the communication portion 21, and the first conductive layer 22 is located in the insulation layer 12.

Specifically, the base 10 includes the silicon substrate 11 and the insulation layer 12. The communication portion 21 is partially located in the silicon substrate 11; the bottom of the second connection layer 212 is lower than the upper surface of the silicon substrate 11, and the thermal expansion coefficient of the second connection layer 212 is less than the thermal expansion coefficient of the first connection layer 211. Therefore, the second connection layer 212 will not be expanded excessively under heat, thereby avoiding the impact on a part of the silicon substrate 11 which is close to the upper surface of the second connection layer 212.

In an embodiment, a functional layer 111 is formed in the silicon substrate 11, and the bottom of the second connection layer 212 is lower than a lower surface of the functional layer 111. That is, a total height of the second connection layer 212 and the third connection layer 213 is not less than a height of the functional layer 111 in the silicon substrate 11, thereby avoiding squeezing the functional layer 111 under thermal expansion. The height of the second connection layer 212 may be greater than the height of the functional layer 111.

It should be noted that various components may be provided in the functional layer 111. Types of the components are not limited herein, and can be selected according to the actual needs. The focus herein is that the second connection layer 212, after overall thermal expansion, will not squeeze the functional layer 111, thereby protecting the functional layer 111.

In an embodiment, the top of the second connection layer 212 is higher than the upper surface of the silicon substrate 11. That is, the height of the second connection layer 212 may be greater than the height of the functional layer 111, thereby protecting the part of the silicon substrate 11 which is close to the insulation layer 12, and avoiding squeezing the functional layer 111.

In some embodiments, the first connection layer 211, the second connection layer 212, and the third connection layer 213 may be columnar structures.

In some embodiments, the second connection layer 212 may have a diameter of 200 nm to 10 μm and a depth of 1 μm to 20 μm. A portion of the second connection layer 212 which enters the silicon substrate 11 has a depth greater than or equal to 1 μm.

Specifically, the silicon substrate 11 may be made of a silicon-containing material. The silicon substrate 11 may be made of any suitable material, including, for example, at least one of silicon, monocrystalline silicon, amorphous silicon, silicon-germanium, monocrystalline silicon-germanium, silicon carbide, or sapphire.

The insulation layer 12 may include silicon dioxide ($SiO_2$), silicon oxide carbon (SiOC), silicon nitride (SiN), silicon carbon nitride (SiCN), and other related integrated-circuit insulation materials.

In an embodiment, as shown in FIG. 1, FIG. 3 and FIG. 5, the semiconductor structure further includes: a second conductive layer 30, the second conductive layer 30 being located in the base 10, the second conductive layer 30 is spaced apart from the first conductive layer 22 and is located above the first conductive layer 22, the first conductive layer 22 is connected to the second conductive layer 30 through connection pillars 31, and the connection pillars 31 are conductive structures.

An embodiment of the present disclosure further provides a semiconductor structure, including: a base 10; and a communication portion 21, the communication portion 21 being located in the base 10, the communication portion 21 includes a first connection layer 211, a second connection layer 212, and a third connection layer 213, the second connection layer 212 being located on the first connection layer 211, and the third connection layer 213 being located on the second connection layer 212; the second connection layer 212 and the third connection layer 213 both include graphene, and thermal expansion coefficients of the second connection layer 212 and the third connection layer 213 are both less than a thermal expansion coefficient of the first connection layer 211.

Compared with the foregoing embodiment, the semiconductor structure in this embodiment includes the first connection layer 211 and graphene located above the first connection layer 211, graphene can effectively avoid impact on the lattice around the communication portion 21, and heat can be transmitted out in time through graphene. In this way, the performance of the semiconductor structure is improved.

It should be noted that, reference may be made to the foregoing embodiment for other related structures, and details are not described herein.

Figure 6:
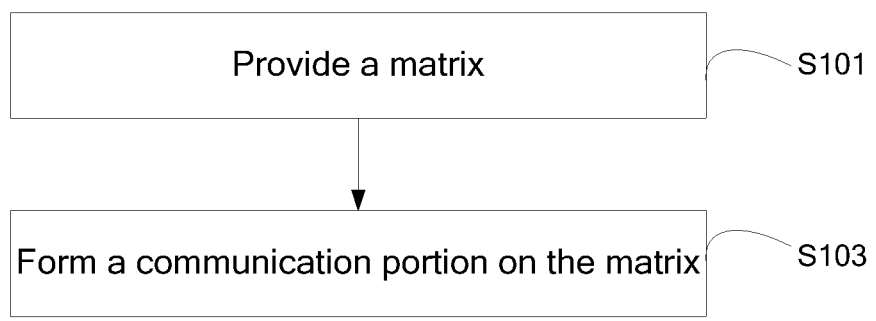
FIG. 6 is a schematic flowchart of a method of manufacturing a semiconductor structure according to an exemplary implementation.

An embodiment of the present disclosure further provides a method of manufacturing a semiconductor structure. Referring to FIG. 6, the method of manufacturing a semiconductor structure includes:

S101: Provide a matrix 13.

S103: Form a communication portion 21 on the matrix 13, the communication portion 21 including a first connection layer 211, a second connection layer 212, and a third connection layer 213, the second connection layer 212 being formed on the first connection layer 211, and the third connection layer 213 being formed on the second connection layer 212.

The first connection layer 211, the second connection layer 212, and the third connection layer 213 include different conductive materials; thermal expansion coefficients of the second connection layer 212 and the third connection layer 213 are both less than a thermal expansion coefficient of the first connection layer 211.

According to the method of manufacturing a semiconductor structure in an embodiment of the present disclosure, a communication portion 21 is formed on a matrix 13, the communication portion 21 including a first connection layer 211, a second connection layer 212, and a third connection layer 213 that are made of different conductive materials; thermal expansion coefficients of the second connection layer 212 and the third connection layer 213 are both less than a thermal expansion coefficient of the first connection layer 211, and the third connection layer 213 is connected to a first conductive layer 22. That is, the second connection layer 212 and the third connection layer 213 change little under thermal expansion, thereby reducing the impact on the lattice around the communication portion 21, thus improving the performance of the semiconductor structure.

In an embodiment, the second connection layer 212 or the third connection layer 213 includes graphene, and the first connection layer 211 includes copper. Copper has a higher thermal expansion coefficient. However, since copper is arranged at the bottom, it does not affect the components be the base 10. The second connection layer 212 or the third connection layer 213 is closer to the components in the base 10, and graphene has a negative thermal expansion coefficient. Therefore, graphene can offset the thermal expansion of copper, thus avoiding the problem of squeezing.

In an embodiment, an opening 14 is formed in the first connection layer 211; the second connection layer 212 and the third connection layer 213 are sequentially formed in the opening 14, that is, the structure shown in FIG. 1 and FIG. 2 is formed.

Figure 7:
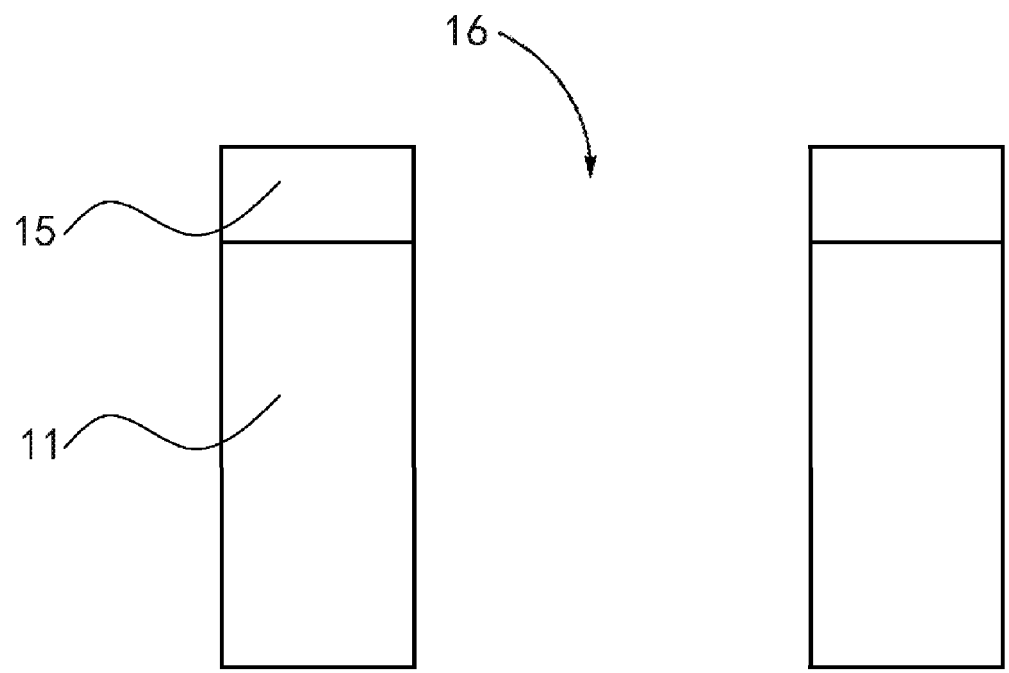
FIG. 7 is a schematic structural diagram of forming a hole in a method of manufacturing a semiconductor structure according to a first exemplary implementation.

Specifically, as shown in FIG. 7, the matrix 13 includes a silicon substrate 11 and a first insulation layer 15. A hole 16 is formed in the silicon substrate 11 and the first insulation layer 15; the hole 16 penetrates the first insulation layer 15 but does not necessarily penetrate the silicon substrate 11, which is not limited herein.

Figure 8:
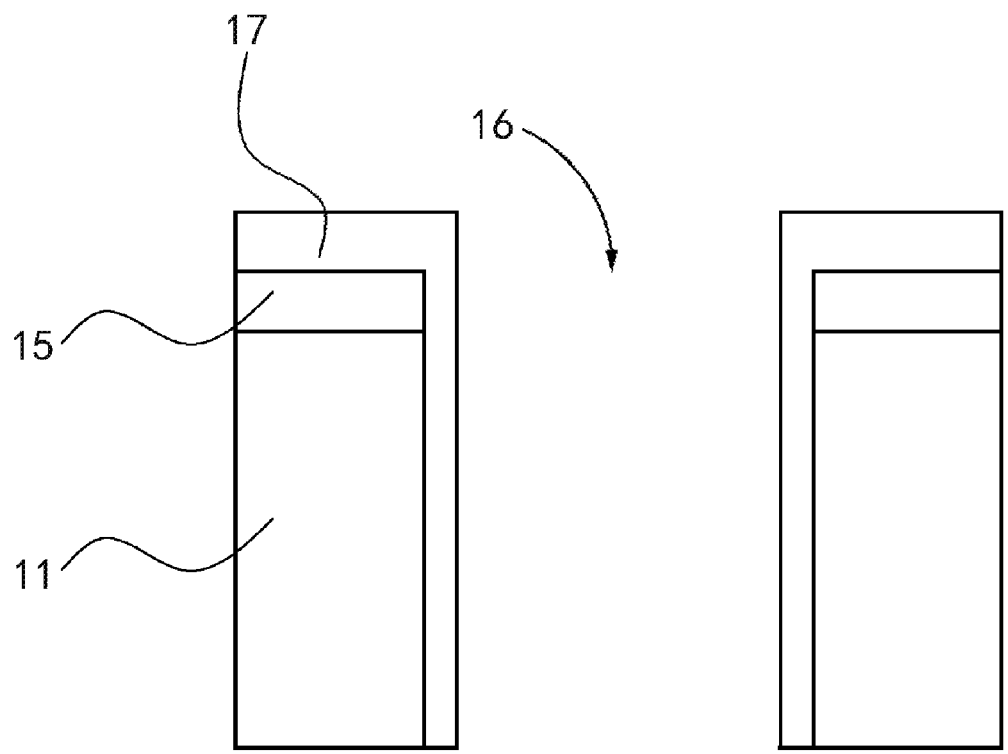
FIG. 8 is a schematic structural diagram of forming a hole in a second insulation layer in the method of manufacturing a semiconductor structure according to the first exemplary implementation.

On the basis of FIG. 7, a second insulation layer 17 is covered on the first insulation layer 15, and the second insulation layer 17 covers the wall of the hole 16, as shown in FIG. 8.

Figure 9:
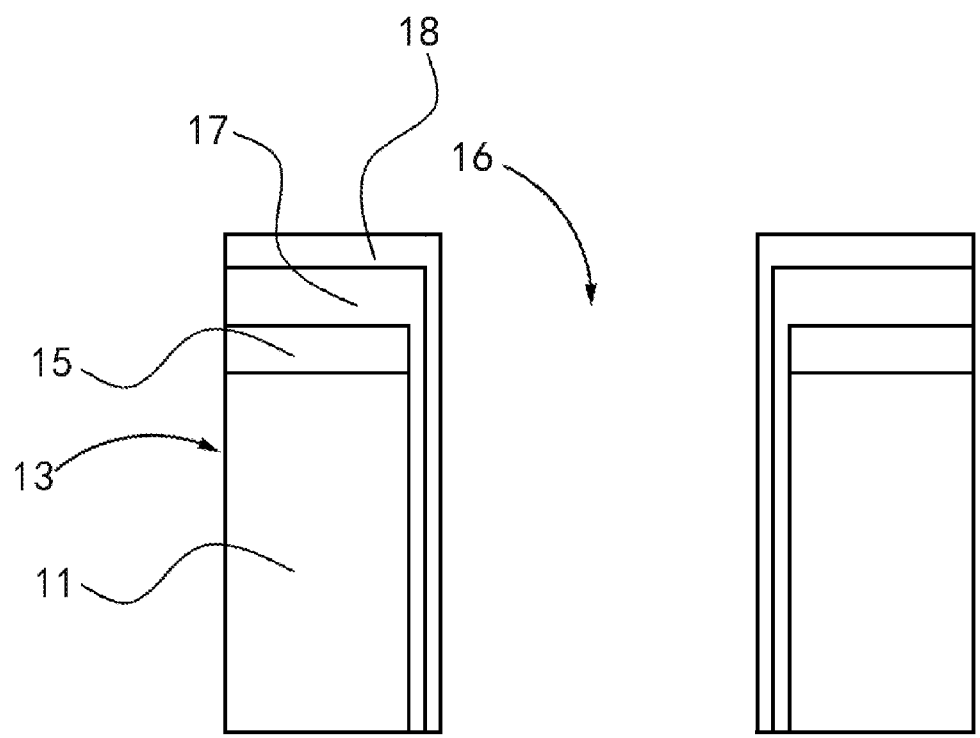
FIG. 9 is a schematic structural diagram of forming a hole in a third insulation layer in the method of manufacturing a semiconductor structure according to the first exemplary implementation.

On the basis of FIG. 8, a third insulation layer 18 is covered on the second insulation layer 17, and the third insulation layer 18 covers an upper surface and side surfaces of the second insulation layer 17, as shown in FIG. 9.

Figure 10:
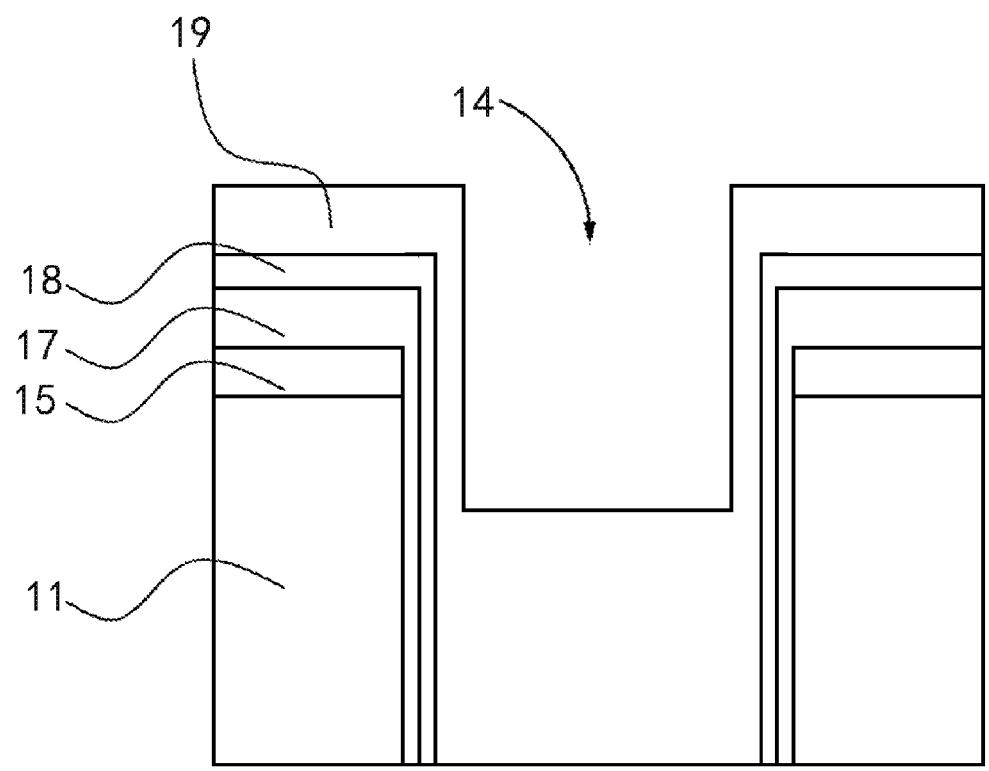
FIG. 10 is a schematic structural diagram of forming a first initial connection layer in the method of manufacturing a semiconductor structure according to the first exemplary implementation.

On the basis of FIG. 9, a first initial connection layer 19 is covered on the third insulation layer 18; the first initial connection layer 19 fills part of the hole 16, and an opening 14 is formed above the first initial connection layer 19, as shown in FIG. 10

Figure 11:
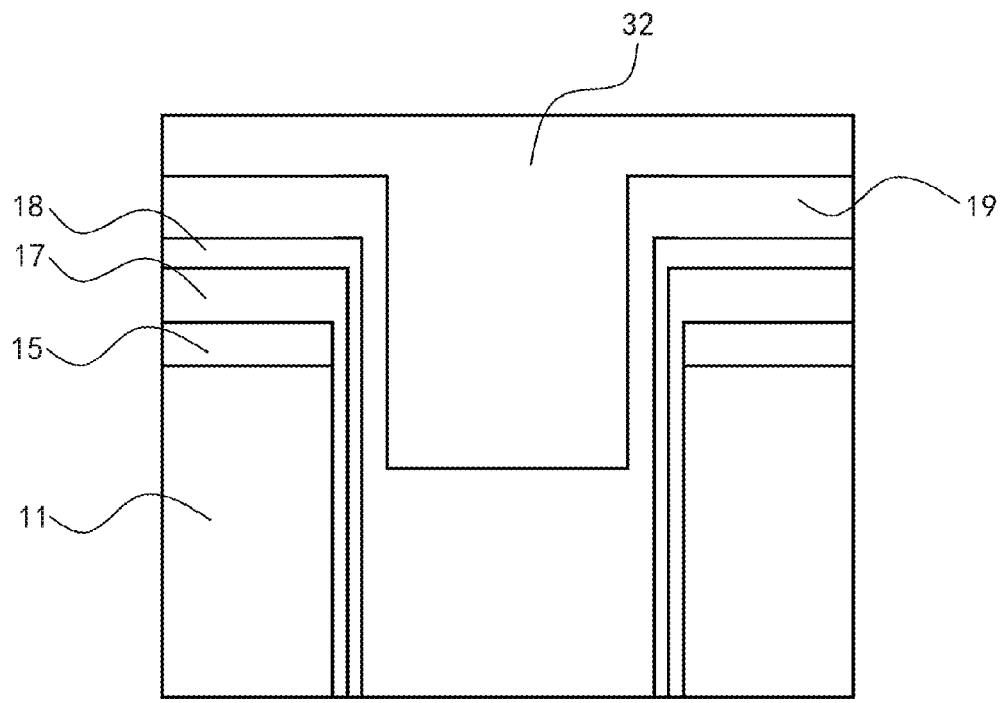
FIG. 11 is a schematic structural diagram of forming a second initial connection layer in the method of manufacturing a semiconductor structure according to the first exemplary implementation.

On the basis of FIG. 10, a second initial connection layer 32 is covered on the first initial connection layer 19, and the second initial connection layer 32 fills the opening 14, as shown in FIG. 11.

Figure 12:
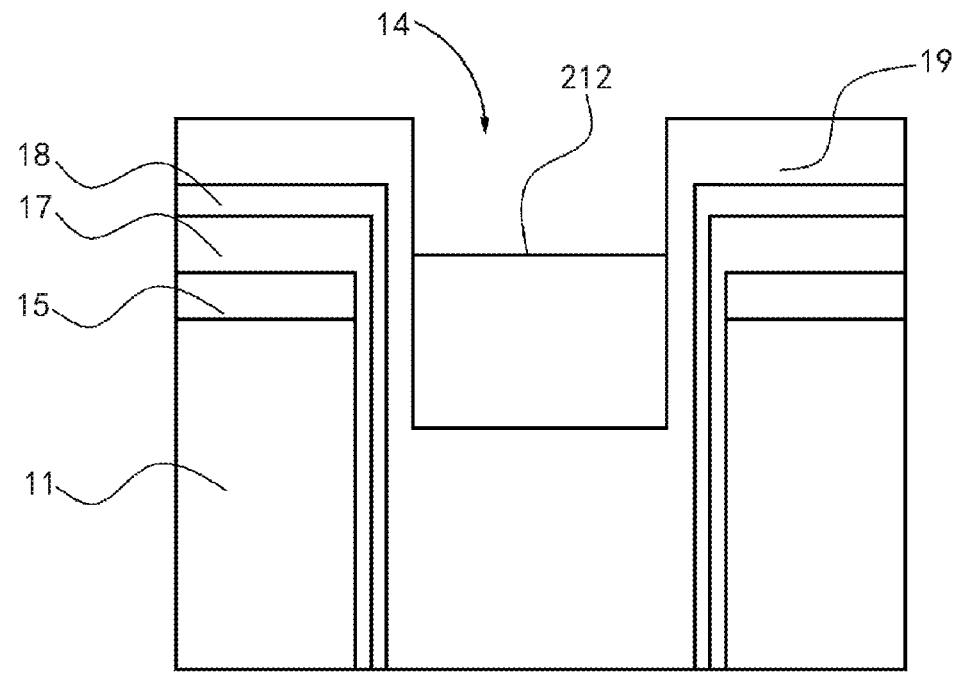
FIG. 12 is a schematic structural diagram of forming a second connection layer in the method of manufacturing a semiconductor structure according to the first exemplary implementation.

On the basis of FIG. 11, a part of the second initial connection layer 32 which covers an upper surface of the first initial connection layer 19 and is located on an outer side of the opening 14 is removed, and the opening 14 is partially exposed, to form the second connection layer 212, as shown in FIG. 12.

Figure 13:
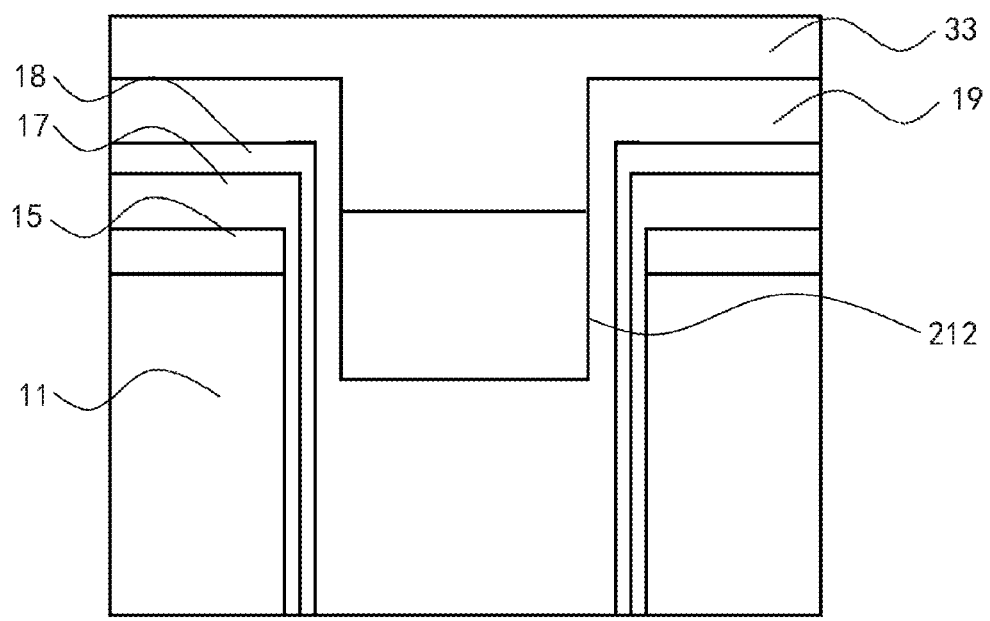
FIG. 13 is a schematic structural diagram of forming a third initial connection layer in the method of manufacturing method of a semiconductor structure according to the first exemplary implementation.

On the basis of FIG. 12, a third initial connection layer 33 is covered on the first initial connection layer 19, and the third initial connection layer 33 fills the opening 14, as shown in FIG. 13.

Figure 14:
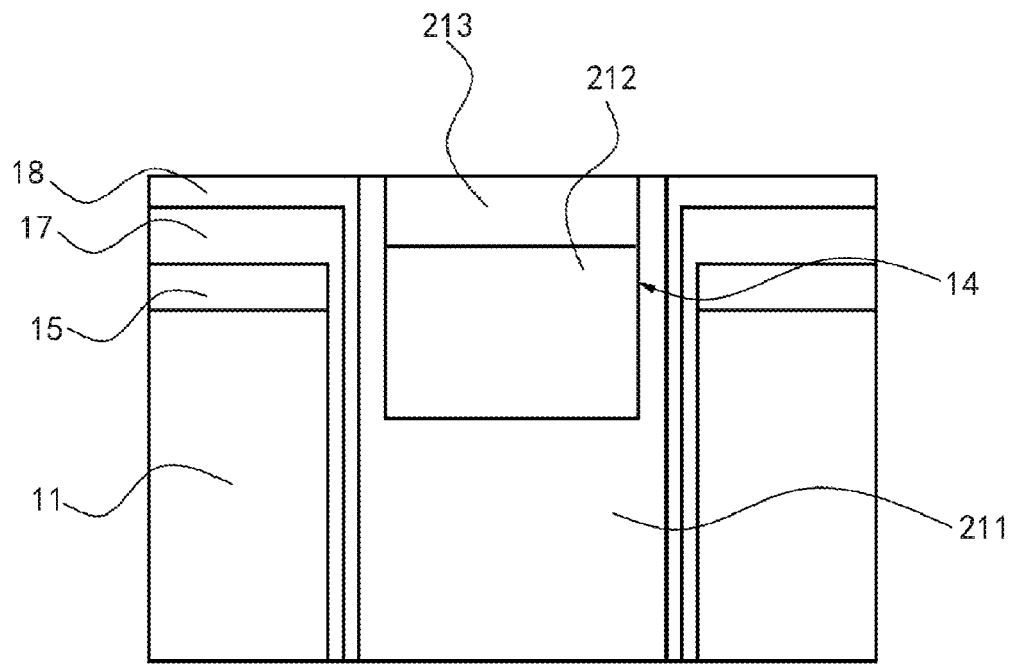
FIG. 14 is a schematic structural diagram of forming a third connection layer in the method of manufacturing a semiconductor structure according to the first exemplary implementation.

On the basis of FIG. 13, the third initial connection layer 33 which covers the upper surface of the first initial connection layer 19 and is located on the outer side of the opening 14, and a part of the first initial connection layer 19 which is located on the third insulation layer 18 are removed, to form the first connection layer 211 and the third connection layer 213, as shown in FIG. 14. That is, the semiconductor structure shown in FIG. 1 can be finally formed.

In an embodiment, the first connection layer 211, the second connection layer 212, and the third connection layer 213 are sequentially formed in the matrix 13. In a direction perpendicular to the matrix 13, projection of the first connection layer 211, projection of the second connection layer 212, and projection of the third connection layer 213 coincide with each other. That is, the structure shown in FIG. 3 and FIG. 4 is formed.

Figure 15:
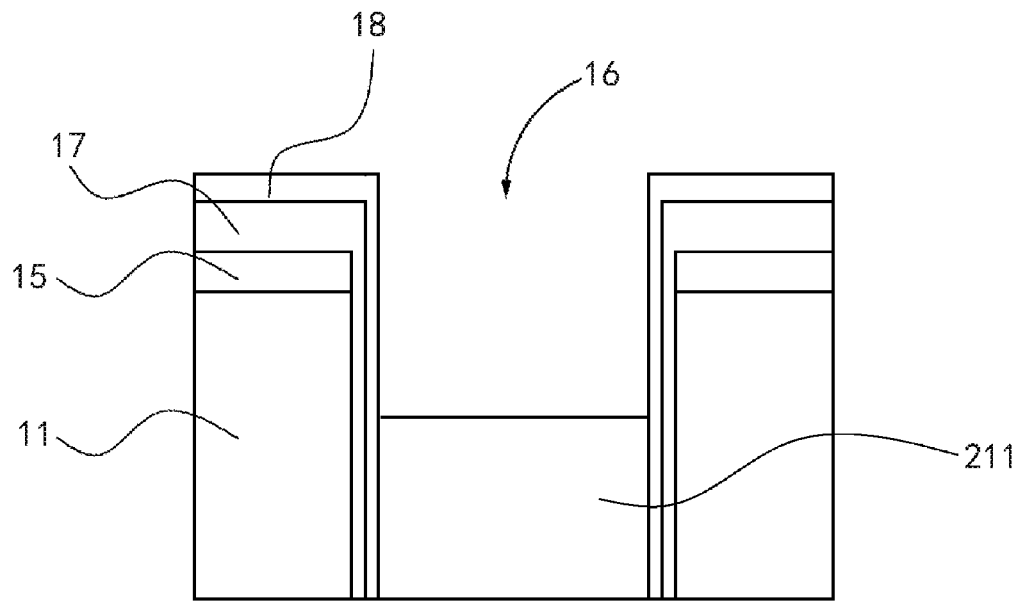
FIG. 15 is a schematic structural diagram of forming a first initial connection layer in a method of manufacturing a semiconductor structure according to a second exemplary implementation.

Specifically, on the basis of FIG. 10, part of the first initial connection layer 19 is removed, that is, an area above the hole 16 is exposed, to form the first connection layer 211, as shown in FIG. 15.

Figure 16:
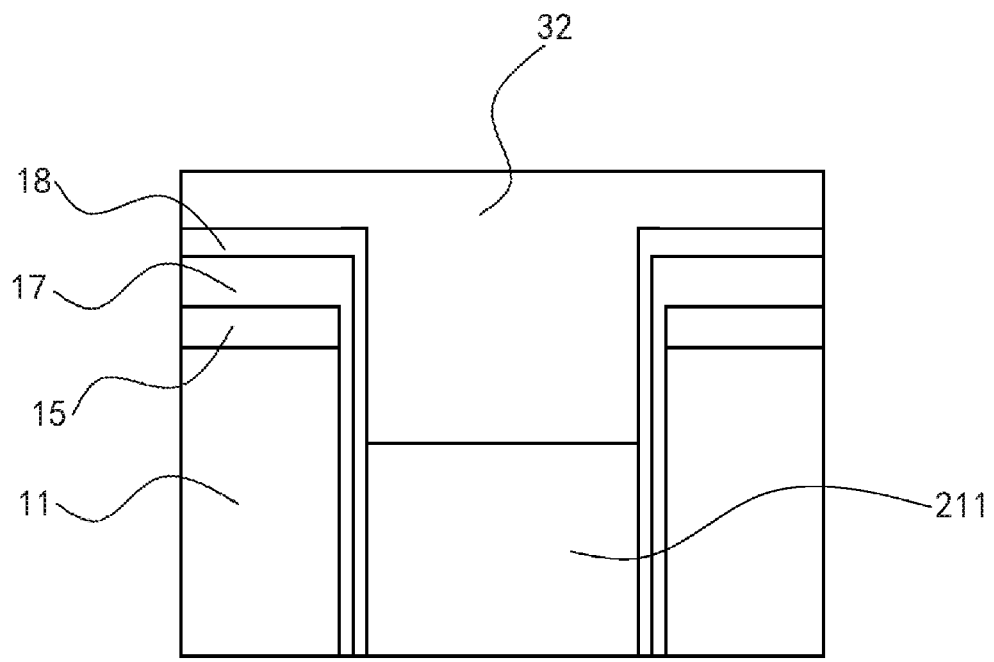
FIG. 16 is a schematic structural diagram of forming a second initial connection layer in the method of manufacturing a semiconductor structure according to the second exemplary implementation.

On the basis of FIG. 15, a second initial connection layer 32 is covered on the third insulation layer 18, and the second initial connection layer 32 fills the hole 16, as shown in FIG. 16.

Figure 17:
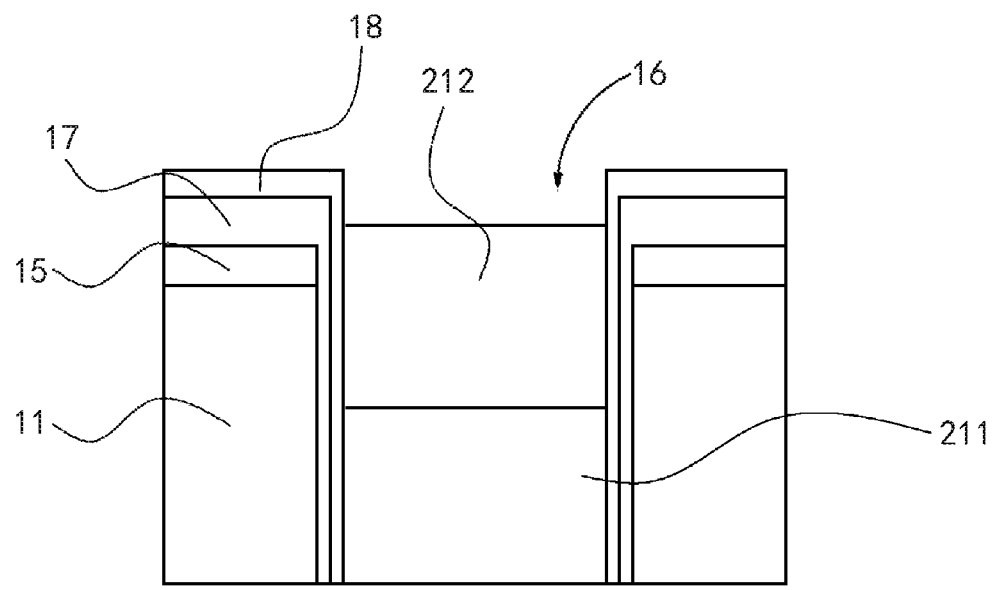
FIG. 17 is a schematic structural diagram of forming a second connection layer in the method of manufacturing a semiconductor structure according to the second exemplary implementation.

On the basis of FIG. 16, the second initial connection layer 32 is partially removed, that is, an area above the hole 16 is exposed, to form the second connection layer 212, as shown in FIG. 17.

Figure 18:
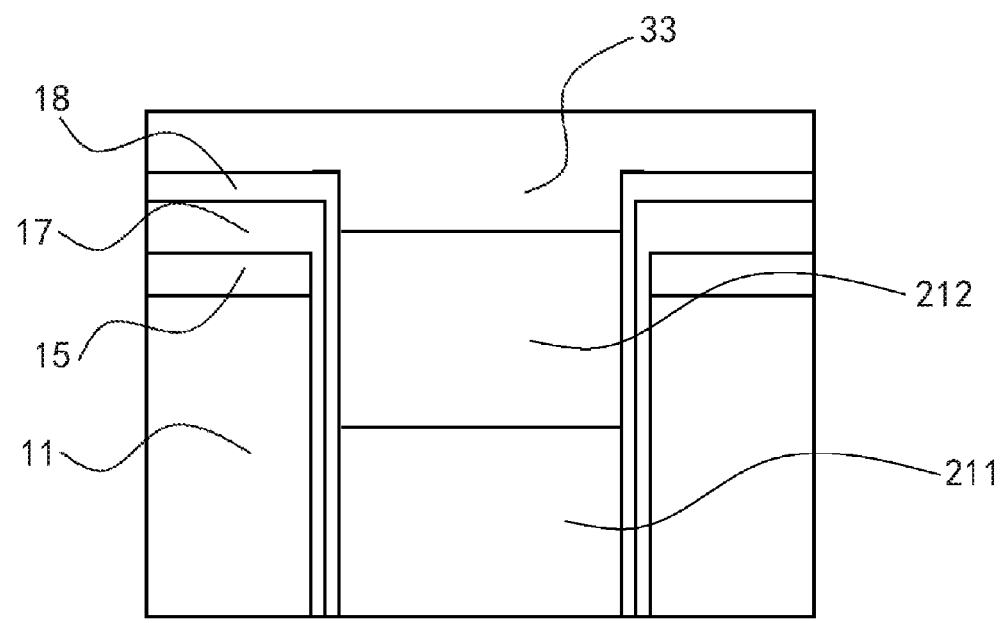
FIG. 18 is a schematic structural diagram of forming a third initial connection layer in the method of manufacturing a semiconductor structure according to the second exemplary implementation.

On the basis of FIG. 17, a third initial connection layer 33 is covered on the third insulation layer 18, and the third initial connection layer 33 fills the hole 16, as shown in FIG. 18.

Figure 19:
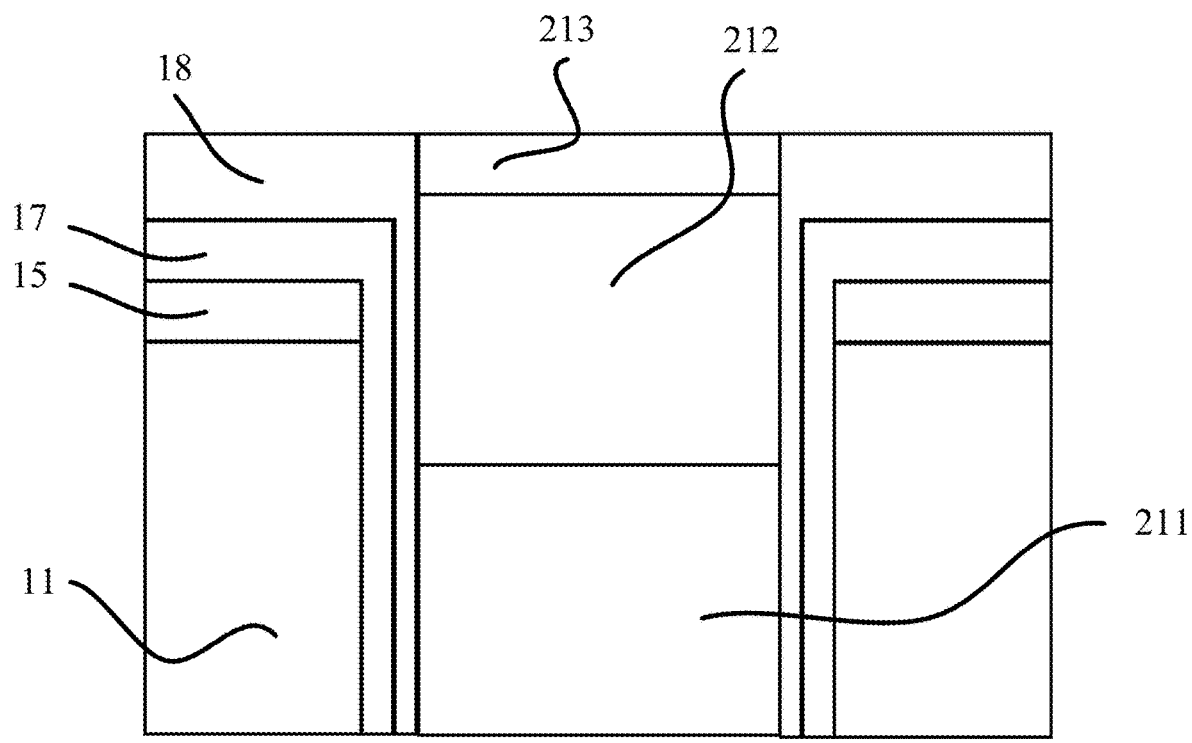
FIG. 19 is a schematic structural diagram of forming a third connection layer in the method of manufacturing a semiconductor structure according to the second exemplary implementation.

On the basis of FIG. 18, the third initial connection layer 33 is partially removed, that is, an upper surface of the third initial connection layer 33 is made to be flush with an upper surface of the third insulation layer 18, to form the third connection layer 213, as shown in FIG. 19. That is, the semiconductor structure shown in FIG. 3 can be finally formed.

It should be noted that, the first insulation layer 15, the second insulation layer 17, and the third insulation layer 18 may include silicon dioxide ($SiO_2$), silicon oxide carbon (SiOC), silicon nitride (SiN), silicon carbon nitride (SiCN), and other related integrated-circuit insulation materials.

It should be noted that, a formation process of the first insulation layer 15, the second insulation layer 17, the third insulation layer 18, the second initial connection layer 32, and the third initial connection layer 33 can be selected from a group consisting of a physical vapor deposition (PVD) process, a chemical vapor deposition (CVD) process, an atomic layer deposition (ALD) process, an in-situ steam generation (ISSG) process, and a spin on dielectric (SOD) process, etc., which is not limited herein.

The formation process of the opening 14 and the hole 16 includes lithography and etching. After each coating is formed, a chemical mechanical polishing (CMP) process can be performed to ensure the flatness of the coating. The first initial connection layer 19 can be formed by a process such as electroplating or sputtering, which is not limited therein.

In an embodiment, the semiconductor structure can be formed by using the foregoing method of manufacturing a semiconductor structure. The method of manufacturing a semiconductor structure can further include forming a second conductive layer 30, and the like, which is not limited herein. The silicon substrate 11 and the various insulation layers described above are all part of the base 10, that is, the matrix 13 is a part of the base 10. The first insulation layer 15, the second insulation layer 17, and the third insulation layer 18 are all part of the insulation layer 12.

A person skilled in the art may easily think of other implementation solutions of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising:
   a base comprising a silicon substrate;
   a communication portion, the communication portion being located in the base and the communication portion comprising a first connection layer, a second connection layer, and a third connection layer, the second connection layer being located on the first connection layer, and the third connection layer being located on the second connection layer;
   wherein a top of the second connection layer is higher than an upper surface of the silicon substrate, a bottom of the second connection layer is lower than an upper surface of the silicon substrate;
   wherein a sum of a heights of the second connection layer and the third connection layer is less than one half of a height of the first connection layer; and
   wherein a thermal expansion coefficient of the second connection layer is less than a thermal expansion coefficient of the third connection layer, and the thermal expansion coefficient of the third connection layer is less than a thermal expansion coefficient of the first connection layer; the first connection layer is made of copper, the second connection layer is made of graphene, and the third connection layer is made of tungsten.

2. The semiconductor structure according to claim 1, wherein the second connection layer is located in the first connection layer.

3. The semiconductor structure according to claim 2, wherein the third connection layer is located in the first connection layer.

4. The semiconductor structure according to claim 3, wherein in a direction perpendicular to the base, a projection of the second connection layer coincides with a projection of the third connection layer;
 wherein a top of the third connection layer is flush with a top of the first connection layer.

5. The semiconductor structure according to claim 1, further comprising:
 an insulation layer, the insulation layer covering the upper surface of the silicon substrate and covering an outer surface of the communication portion.

6. The semiconductor structure according to claim 5, wherein a functional layer is formed in the silicon substrate, and the bottom of the second connection layer is lower than a lower surface of the functional layer.

7. The semiconductor structure according to claim 5, wherein a portion of the second connection layer entering the silicon substrate has a depth greater than or equal to 1 μm.

8. The semiconductor structure according to claim 1, wherein the second connection layer has a diameter of 200 nm to 10 μm, and the second connection layer has a depth of 1 μm to 20 μm.

9. A method for forming the semiconductor structure of claim 1, comprising:
 providing a base comprising a silicon substrate;
 forming a communication portion on the base, the communication portion comprising a first connection layer, a second connection layer, and a third connection layer, the second connection layer being formed on the first connection layer, and the third connection layer being formed on the second connection layer;
 wherein a top of the second connection layer is higher than an upper surface of the silicon substrate, a bottom of the second connection layer is lower than an upper surface of the silicon substrate;
 wherein a sum of a heights of the second connection layer and the third connection layer is less than one half of a height of the first connection layer; and
 wherein a thermal expansion coefficient of the second connection layer is less than a thermal expansion coefficient of the third connection layer, and the thermal expansion coefficient of the third connection layer is less than a thermal expansion coefficient of the first connection layer; the first connection layer is made of copper, the second connection layer is made of graphene, and the third connection layer is made of tungsten.

10. The method according to claim 9, wherein an opening is formed in the first connection layer, and the second connection layer and the third connection layer are sequentially formed in the opening.

11. The method according to claim 9, wherein the first connection layer, the second connection layer, and the third connection layer are sequentially formed in the base;
 wherein in a direction perpendicular to the base, a projection of the second connection layer coincides with, a projection of the third connection layer.

* * * * *